US008518784B2

(12) United States Patent
Kronholz et al.

(10) Patent No.: US 8,518,784 B2
(45) Date of Patent: Aug. 27, 2013

(54) ADJUSTING OF STRAIN CAUSED IN A TRANSISTOR CHANNEL BY SEMICONDUCTOR MATERIAL PROVIDED FOR THRESHOLD ADJUSTMENT

(75) Inventors: Stephan Kronholz, Dresden (DE); Thorsten Kammler, Ottendorf-Okrilla (DE); Gunda Beernink, Dresden (DE); Carsten Reichel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 400 days.

(21) Appl. No.: 12/648,744

(22) Filed: Dec. 29, 2009

(65) Prior Publication Data

US 2010/0164016 A1 Jul. 1, 2010

(30) Foreign Application Priority Data

Dec. 31, 2008 (DE) .................... 10 2008 063 432

(51) Int. Cl.
*H01L 21/336* (2006.01)
(52) U.S. Cl.
USPC ........................ 438/289; 438/514; 257/402
(58) Field of Classification Search
USPC ............ 257/19, 77, 316, 347, 369, 402, 616; 438/197, 199, 229, 514, 758, 289
See application file for complete search history.

(56) References Cited

U.S. PATENT DOCUMENTS

| 7,091,522 | B2 * | 8/2006 | Lee et al. ..................... 257/77 |
| 2006/0046507 | A1 * | 3/2006 | Tweet ........................ 438/758 |
| 2006/0097318 | A1 | 5/2006 | Li .............................. 257/347 |
| 2007/0254461 | A1 * | 11/2007 | Wei et al. ................... 438/514 |
| 2007/0293003 | A1 | 12/2007 | Currie et al. ............... 438/197 |

OTHER PUBLICATIONS

Translation of Official Communication from German Patent Office for German Patent Application No. 10 2008 063 432.8-33 dated Mar. 9, 2010.

* cited by examiner

*Primary Examiner* — Kimberly Rizkallah
*Assistant Examiner* — Errol Fernandes
(74) *Attorney, Agent, or Firm* — Williams, Morgan & Amerson, P.C.

(57) ABSTRACT

The threshold voltage of a sophisticated transistor may be adjusted by providing a specifically designed semiconductor alloy in the channel region of the transistor, wherein a negative effect of this semiconductor material with respect to inducing a strain component in the channel region may be reduced or over-compensated for by additionally incorporating a strain-adjusting species. For example, a carbon species may be incorporated in the channel region, the threshold voltage of which may be adjusted on the basis of a silicon/germanium alloy of a P-channel transistor. Consequently, sophisticated metal gate electrodes may be formed in an early manufacturing stage.

20 Claims, 7 Drawing Sheets

ADJUSTING OF STRAIN CAUSED IN A TRANSISTOR CHANNEL BY SEMICONDUCTOR MATERIAL PROVIDED FOR THRESHOLD ADJUSTMENT

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric of increased permittivity compared to gate dielectrics, such as silicon dioxide and silicon nitride.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be restricted to high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may no longer be compatible with requirements for performance driven circuits.

Therefore, replacing silicon dioxide as the material for gate insulation layers has been considered, particularly for extremely thin silicon dioxide gate layers. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials, such as tantalum oxide ($Ta_2O_5$), with a k of approximately 25, strontium titanium oxide (Sr- TiO$_3$), having a k of approximately 150, hafnium oxide (HfO$_2$), HfSiO, zirconium oxide (ZrO$_2$) and the like.

When advancing to sophisticated gate architecture based on high-k dielectrics, additionally, transistor performance may also be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Since, typically, a low threshold voltage of the transistor, which represents the voltage at which a conductive channel forms in the channel region, is desired to obtain the high drive currents, commonly, the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll-off, and also reducing significant variations of transistor performance with a variation in gate length. Since the threshold voltage of the transistors is significantly determined by the work function of the gate material that is in contact with the gate dielectric material, an appropriate adjustment of the effective work function with respect to the conductivity type of the transistor under consideration has to be guaranteed.

For example, appropriate metal-containing gate electrode materials, such as titanium nitride, aluminum oxide and the like, may frequently be used, wherein the corresponding work function may be adjusted so as to be appropriate for one type of transistor, such as N-channel transistors, while P-channel transistors may require a different work function and thus a differently treated titanium nitride material or any other appropriate metal-containing material in order to obtain the desired threshold voltage. In this case, complex and sophisticated manufacturing regimes may be required to provide different gate electrode materials in order to comply with the requirements of different transistor types. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique, which may also represent an additional complex process step, which, however, may provide reduced overall process complexity compared to the provision of the different metal-containing gate electrode materials or which may provide increased flexibility in obtaining appropriate transistor characteristics.

The adjustment of the band gap and thus of the threshold of sophisticated transistor elements on the basis of an appropriately selected semiconductor alloy, such as silicon/germanium, is a promising approach for sophisticated transistor elements comprising a metal gate, wherein, however, the presence of the threshold adjusting semiconductor alloy may interfere with other mechanisms for enhancing transistor performance. It is well known that switching speed and drive current capability of silicon-based field effect transistors may be increased by modifying the lattice structure in the channel region of the transistor. That is, by creating compressive or tensile strain in the channel region of the transistor, the charge carrier mobility may be increased, thereby achieving the desired increase of transistor performance. For example, a compressive strain component induced along the current flow direction of a P-channel transistor for a standard crystallographic configuration of the silicon region, i.e., a (100) surface orientation of the silicon material with the current flow direction being aligned along a (110) crystallographic axis, may provide a significant increase of the hole mobility. On the other hand, a tensile strain component in the channel region of an N-channel transistor may increase electron mobility. On the other hand, a tensile strain component in a P-channel transistor may result in a reduction of charge carrier mobility, thereby negatively affecting the transistor characteristics. Consequently, the incorporation of a threshold adjusting semiconductor alloy in the channel region adjacent to the gate dielectric material may thus result in a modification of the lattice structure, which in turn may influence the overall transistor characteristics. In the case of a P-channel transistor, the presence of the silicon/germanium alloy at the interface between the gate dielectric material and the channel of the transistor may provide an efficient mechanism for appropriately positioning the valence band with respect to the work function of the metal electrode material, however, at the same time the silicon/germanium alloy may modify the lattice structure within the channel region. The silicon/germanium material has a natural lattice constant, that is, a lattice constant when provided in a substantially stress-free manner, that is greater than the natural lattice constant of silicon. Consequently, upon forming a crystalline silicon/germanium alloy on a silicon template material a corresponding lattice mismatch may result in the corresponding "distortion" of the silicon/germanium lattice and the silicon lattice adjacent to the silicon/germanium material. Thus, a corresponding lattice distortion may result in a tensile strain in the silicon material, thereby reducing the hole mobility as discussed above. Furthermore, this tensile strain component may be superimposed on a corresponding compressive strain component provided by other strain-inducing mechanisms, such as a strain created by a silicon/germanium alloy which may be locally provided in the drain and source areas. Furthermore, other strain-inducing mechanisms may typically be applied, for instance by forming highly-stressed dielectric materials above the basic transistor structure, so that the efficiency of these mechanisms may also be reduced due to the presence of the threshold-adjusting material in the channel region.

As a consequence, since threshold adjusting by providing a silicon/germanium alloy in the channel region of P-channel transistors for appropriate adaptation to the work function of a metal electrode material, as well as increasing transistor performance by providing a compressive strain component in the channel region, are individually very promising and efficient strategies, a combination without significant loss of efficiency of at least one of these mechanisms may be difficult on the basis of conventional process regimes.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which sophisticated gate electrode structures may be provided in an early manufacturing stage, e.g., prior to performing any high temperature processes as are typically used for forming drain and source regions of field effect transistors, by adjusting the threshold of at least one type of transistor on the basis of a semiconductor alloy incorporated into the silicon-based channel region, wherein a negative effect of a corresponding lattice modification may be reduced or even compensated for or over compensated. For this purpose, an additional strain-adjusting species may be incorporated into the semiconductor alloy and/or into the silicon material adjacent to the semiconductor alloy in order to reduce any lattice distortion or even compensate for or over compensate for the corresponding lattice distortion, wherein, additionally, the strain-adjusting species may have the same valence as the basic silicon material, thereby not affecting the overall dopant concentration in the channel material. In some illustrative aspects disclosed herein, a silicon/germanium alloy may be used in combination with a carbon species so as to obtain an appropriate threshold voltage for P-channel transistors, while reducing or compensating for a corresponding tensile strain component, which may be introduced by the silicon/germanium alloy. Consequently, the efficiency of other strain-inducing mechanisms may not be unduly affected by the semiconductor alloy in the channel region.

One illustrative method disclosed herein comprises forming a layer of a silicon-containing semiconductor alloy on a silicon-containing crystalline semiconductor region, wherein the semiconductor alloy comprises a first non-silicon species. The method additionally comprises introducing a second non-silicon species into at least one layer of the silicon-containing semiconductor alloy and the silicon-containing crystalline semiconductor region, wherein the second non-silicon species has the same valence as silicon and is different compared to the first non-silicon species. Finally, the method comprises forming a gate electrode structure of a transistor above the layer of silicon-containing semiconductor alloy, wherein the gate electrode structure comprises a high-k dielectric gate insulation layer and a metal-containing gate electrode material formed on the high-k dielectric gate insulation layer.

A further illustrative method disclosed herein comprises forming a threshold-adjusting semiconductor material on a silicon-containing semiconductor region. The method additionally comprises providing a strain-adjusting species at least in the threshold-adjusting semiconductor material. Finally, the method comprises forming a gate electrode structure of a transistor on the threshold-adjusting semiconductor material, wherein the gate electrode structure comprises a high-k dielectric material formed at least on the threshold-adjusting semiconductor material, and wherein the gate electrode structure further comprises a metal-containing electrode material formed on the high-k dielectric material.

One illustrative semiconductor device disclosed herein comprises a transistor, which in turn comprises a silicon-containing semiconductor region formed above a substrate. The transistor further comprises a gate electrode structure formed above the silicon-containing semiconductor region, wherein the gate electrode structure comprises a high-k gate insulation layer and a metal-containing electrode material formed on the high-k gate insulation layer. Additionally, the transistor comprises a channel region that comprises a threshold-adjusting semiconductor material, which in turn comprises a first tetravalent non-silicon species that is in contact with the high-k gate insulation layer. The channel region further comprises a strain adjustment tetravalent non-silicon species that is different from the first non-silicon species.

BRIEF DESCRIPTION OF THE DRAWINGS

The disclosure may be understood by reference to the following description taken in conjunction with the accompanying drawings, in which like reference numerals identify like elements, and in which.

Figure 1A:
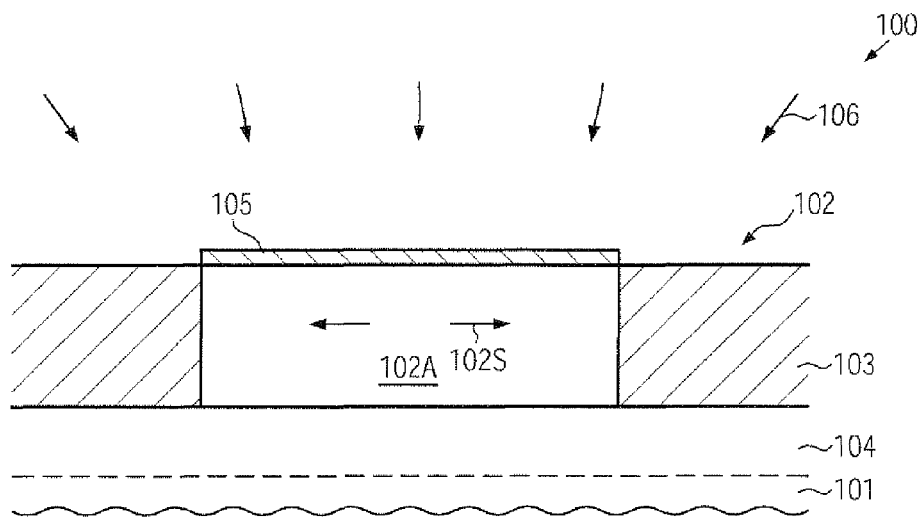
FIG. 1a schematically illustrates a cross-sectional view of a transistor element at an early manufacturing stage, in which a threshold adjusting semiconductor alloy may be formed according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques in which epitaxial growth techniques may be applied at an early manufacturing stage, for example, prior to forming corresponding gate electrode structures, in order to adjust transistor characteristics, while providing enhanced stability in adjusting the overall strain level in the channel region of at least one type of transistor. To this end, in addition to appropriately adjusting the band gap of the channel material to the electronic characteristics, i.e., the work function of a gate electrode material, the strain state of the channel region may be appropriately adjusted by incorporating an appropriate species, without affecting the overall dopant concentration in the channel material. In some illustrative embodiments disclosed herein, the valence band edge of the channel material may be appropriately positioned with respect to a metal-containing electrode material by using a silicon/germanium alloy wherein, however, the negative effects of the silicon/germanium lattice on the overall channel material may be reduced or compensated for by introducing an additional tetravalent species, such as carbon, which may therefore reduce the tensile strain component or which may even produce a compressive strain component, thereby enhancing hole mobility in the channel region as discussed above. The incorporation of the strain-adjusting species may be accomplished by ion implantation, thereby enabling precise control of the concentration and thus of the strain-adjusting effect of a tetravalent species on the basis of the implantation process parameters. In other illustrative embodiments, additionally or alternatively to performing an ion implantation process, the tetravalent species may be incorporated during an epitaxial growth sequence during which the semiconductor alloy may also be deposited, which is used for adjusting the threshold voltage of the transistor device under consideration. For example, the strain-adjusting species may be incorporated during an initial phase and may also be incorporated during the deposition of the threshold-adjusting semiconductor alloy, while, in other cases, the semiconductor alloy, including the threshold-adjusting species and the strain-adjusting species, may be deposited concurrently.

During the further processing, the sophisticated gate electrode structure including a high-k dielectric material and the metal-containing electrode material may be formed with a high degree of compatibility with existing manufacturing strategies, wherein any strain-inducing mechanisms may then be provided as required by the overall transistor characteristics. Due to the incorporation of the strain-adjusting species, a negative influence of the threshold voltage adjusting material may be significantly reduced or even over-compensated for so that transistor performance may be increased on the basis of the two mechanisms, i.e., the superior electrode structure and the strain component created in the channel region. In this way, the incorporation of the strain-adjusting species may provide an additional degree of freedom in tailoring transistor characteristics in combination with a strain-inducing mechanism, such as a strain-inducing semiconductor alloy embedded in the drain and source areas of the transistor, thereby also increasing the overall design flexibility of sophisticated semiconductor devices.

FIG. 1a schematically illustrates a cross-sectional view of a semiconductor device 100 at an early manufacturing stage. As illustrated, the device 100 may comprise a substrate 101, which may represent any appropriate carrier material for forming thereabove a silicon-containing semiconductor layer 102. Furthermore, in some illustrative embodiments, the substrate 101, in combination with the semiconductor layer 102, may represent a silicon-on-insulator (SOI) configuration when a buried insulating layer 104 may be provided between the semiconductor layer 102 and the substrate 101 as indicated by the dashed lines. In other cases, the device 100 may represent a "bulk" configuration in which the semiconductor layer 102 may represent an upper portion of a crystalline semiconductor material of the substrate 101. It should further be appreciated that the SOI configuration as shown in FIG. 1a may be provided in certain device areas while other areas may be formed on the basis of a bulk architecture depending on the overall device requirements. Furthermore, in the manufacturing stage shown, an appropriate isolation structure 103, for instance in the form of a shallow trench isolation, may be provided in the semiconductor layer 102, thereby defining an active region 102A which may be understood as a silicon-containing semiconductor region in and above which at least one transistor element is to be formed. For example, in the embodiment shown, the active region 102A may represent an appropriately doped silicon-based semiconductor material for forming therein and thereabove a P-channel transistor. Furthermore, the semiconductor device 100 may have formed on, at least on the active region 102A, a layer of a semiconductor alloy 105 that may have an appropriate composition so as to provide an appropriate band gap structure that, in combination with a high-k gate dielectric material and a metal-containing electrode material, may result in a desired threshold of the transistor still to be formed in and above the active region 102A. In one illustrative embodiment, the layer 105 may be comprised of a silicon/germanium alloy with a specific germanium concentration of approximately 15-25 atomic percent, depending on the overall device requirements. A thickness of the layer 105 may be approximately 2-10 nm, wherein, however, any other thickness values may be selected in accordance with the configuration of the transistor to be formed.

The semiconductor device 100 as illustrated in FIG. 1a may be formed on the basis of the following processes. After forming the isolation structures 103, which may be accomplished by sophisticated lithography, etch, deposition, oxidation and planarization processes, the basic doping in active region 102A may be established, for instance, by ion implantation using appropriate masking regimes on the basis of well-established strategies. If required, an anneal process may be performed to activate dopants and re-crystallize implantation-induced damage. Thereafter, the surface of the active region 102A may be prepared for the deposition of the layer 105, which may be accomplished by performing one or more cleaning processes, such as wet chemical cleaning processes, for instance on the basis of diluted hydrofluoric acid (HF), in order to remove silicon oxide materials together with other contaminants and the like that may have deposited on exposed surface portions during the preceding manufacturing processes. Next, the semiconductor device 100 may be exposed to the ambient of a deposition process 106 which may be established in any appropriate deposition tool. For example, the deposition ambient 106 may be established on the basis of well-known process parameters so as to form a silicon-based semiconductor alloy, such as a silicon/germanium material, wherein deposition of material may be substantially restricted to exposed crystalline surface areas, i.e., the active region 102A, while a deposition of material on dielectric surface areas may be negligible. It should be appreciated that other active regions may be covered by an appropriate mask layer, such as an oxide material and the like, as will be explained later on in more detail. For instance, by selecting an appropriate substrate temperature in the range of approximately 500-800° C. and supplying appropriate precursor materials which are well known from CVD-based deposition techniques, the layer 105 may deposit with an appropriate concentration of a threshold-adjusting species, such as germanium, while, if desired, a dopant species may also be incorporated, while, in other cases, a substantially intrinsic semiconductor alloy including a tetravalent species may be deposited. As previously discussed, the layer 105 may have a different "natural" lattice constant compared to the template material of the active region 102A so that the material layer 105 may be formed in a strained state, which may also result in a corresponding interaction with the underlying implanted material, thereby also creating a corresponding strain component. For example, silicon/germanium alloy formed on a substantially pure silicon material, except for any impurities, may result in a tensile strain component in portions of the silicon material adjacent to the layer 105 due to the tendency of the material 105 to expand. In case of the P-channel transistor, a corresponding tensile strain component 102S directed along the current flow direction may negatively influence the hole mobility and thus the drive current of the transistor still to be formed.

Figure 1B:
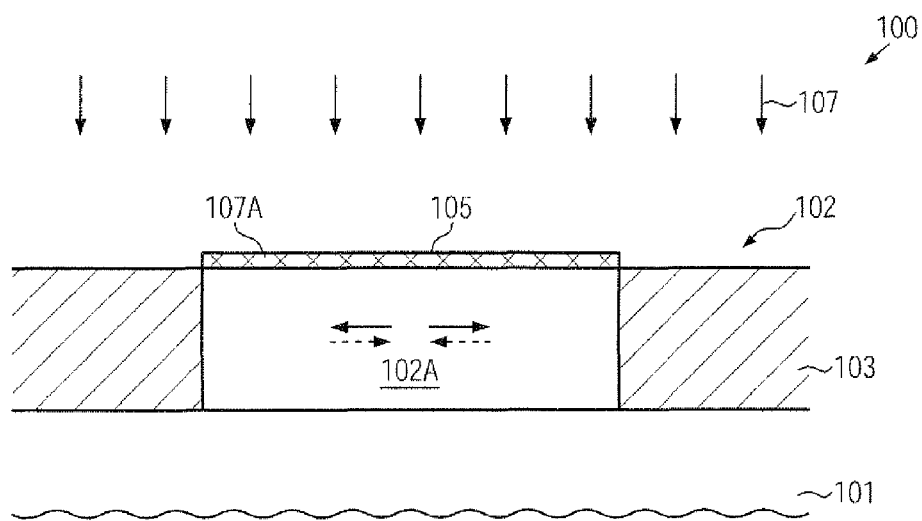
FIG. 1b schematically illustrates the transistor element during a process sequence for incorporating a strain-adjusting species, for instance by ion implantation, according to illustrative embodiments.

FIG. 1b schematically illustrates the semiconductor device 100 in an advanced manufacturing stage in which the active region 102A is exposed to an ion bombardment 107, during which, for example, a tetravalent species 107A is incorporated at least into the layer 105 and possibly also in material of the region 102A positioned below the layer 105. In one illustrative embodiment, the tetravalent species 107A may be provided in the form of carbon, which, when incorporated in a silicon-based lattice, may result in a lattice structure having a natural lattice constant that is less than the lattice constant of non-disturbed silicon material. Consequently, upon re-crystallizing or "activating" the species 107A, i.e., by placing at least a significant amount thereof at regular lattice sites, the silicon-based layer 105 containing the species 107A may have a tendency to contract, which may also act on the surrounding materials, thereby reducing or even compensating for or over-compensating for the previously-induced compressive strain component 102S (FIG. 1a). For example, by incorporating a maximum concentration of approximately one to several atomic percent of carbon, a significant reduction of the compressive strain component 102S may be accomplished for the above-specified germanium concentrations in the layer 105. It should be appreciated that appropriate process parameters for the implantation process 107 may be readily established by simulation and test runs in which the degree of strain-adjusting effect may be correlated with process parameters, such as implantation energy, dose and parameters of subsequent manufacturing processes which may also include anneal processes to be performed in a later manufacturing stage in order to activate dopants and re-crystallize implantation-induced damage in a very advanced stage of the overall manufacturing flow. Consequently, depending on the overall process strategy, a corresponding strain-adjusting effect may be created at a later stage, for instance, during an epitaxial growth process that may be performed to incorporate a strain-inducing semiconductor alloy in drain and source areas of the active region 102A, as will be described later on in more detail. In other cases, an anneal process may be performed after the implantation 107 and prior to performing further high temperature process steps.

Figure 1C:
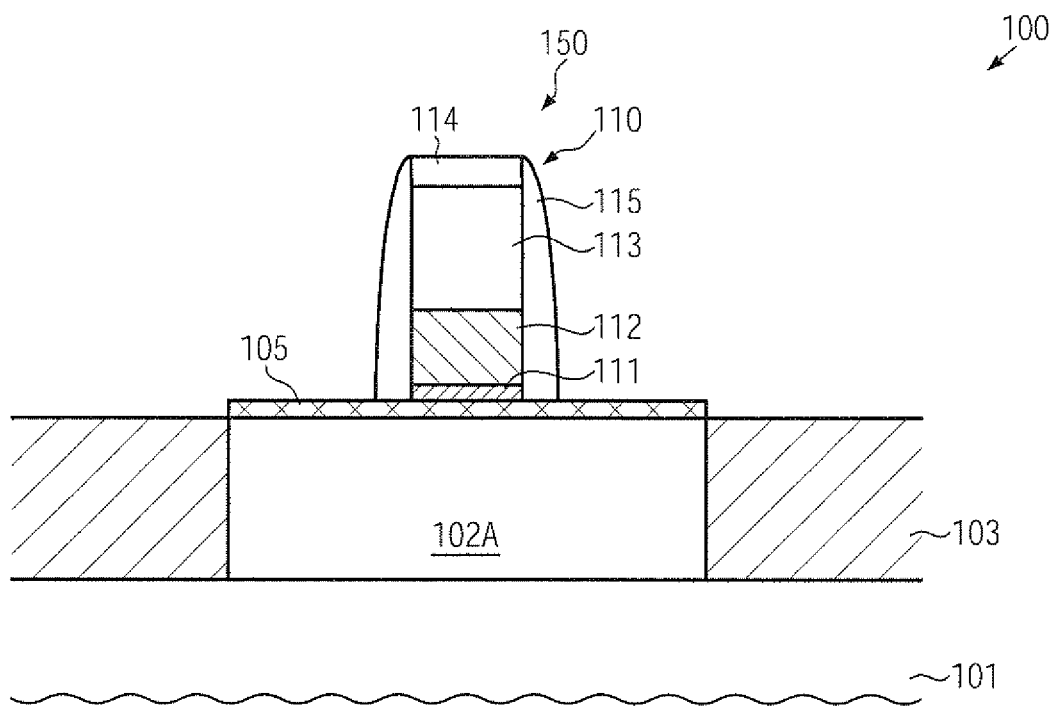
FIGS. 1c-1f schematically illustrate cross-sectional views of the transistor during various manufacturing stages in completing the basic transistor configuration and using at least one strain-inducing mechanism, according to still further illustrative embodiments.

FIG. 1c schematically illustrates the semiconductor device 100 in a further advanced manufacturing stage. In this stage, a gate electrode structure 110 of a transistor 150, which, in one illustrative embodiment, represents a P-channel transistor, may be formed on the layer 105. The gate electrode structure 110 may comprise a gate insulation layer 111 comprising a high-k dielectric material, i.e., a dielectric material having a dielectric constant of 10.0 and higher in order to enhance channel controllability, as previously explained. For instance, one or more of the above specified high-k dielectric materials may be used, possibly in combination with a very thin "conventional" dielectric material, such as silicon dioxide and the like. Moreover, a metal-containing electrode material 112 is formed on the high-k insulation layer 111, that is, the material 112 may be formed in direct contact with the layer 111. Additionally, a further electrode material 113 may be provided, for instance, in the form of polysilicon or any other material, to provide the desired compatibility with existing manufacturing strategies and/or provide the ion-blocking capability of the gate electrode structure 110 during the further processing, for instance in view of implanting dopant species and the like. Furthermore, according to the illustrative embodiment shown in FIG. 1c, the gate electrode structure 110 may comprise a cap layer 114, for instance, comprised of silicon nitride, and sidewall spacers 115, so that the gate electrode materials 113 and 112 and the gate insulation layer 111 are encapsulated by dielectric materials.

The transistor 150 as illustrated in FIG. 1c may be formed on the basis of the following processes. After forming the gate insulation layer 111 by depositing an appropriate material on the basis of well-established chemical vapor deposition (CVD) techniques, possibly with a preceding process step for forming a conventional dielectric material in view of interface characteristics, the metal-containing gate electrode material 112 may be deposited, for instance, in the form of aluminum oxide and the like, followed by the deposition of a further material, such as polysilicon and the like. Furthermore, material of the cap layer 114 may be formed and thereafter a sophisticated patterning sequence may be performed on the basis of lithography and anisotropic etch techniques in order to appropriately pattern previously formed materials, thereby also defining the lateral dimension of the gate electrode structure 110, i.e., of the materials 113, 112 and 111. For example, in sophisticated applications, a length of the gate electrode structure 110, i.e., the horizontal extension of the gate electrode material 112 in FIG. 1c, may be approximately 50 nm and less. After the gate patterning sequence, the spacer element 115 may be formed, for instance, on the basis of well-established techniques including the deposition of dielectric materials such as silicon nitride followed by an anisotropic etch process. It should be appreciated that, due to the presence of the layer 105, an appropriate adaptation of the band gap structure to the work function of the material 112 may be accomplished, thereby also providing a desired threshold voltage in combination with sophisticated dopant profiles still to be formed in the active region 102A in a later manufacturing stage.

Figure 1D:
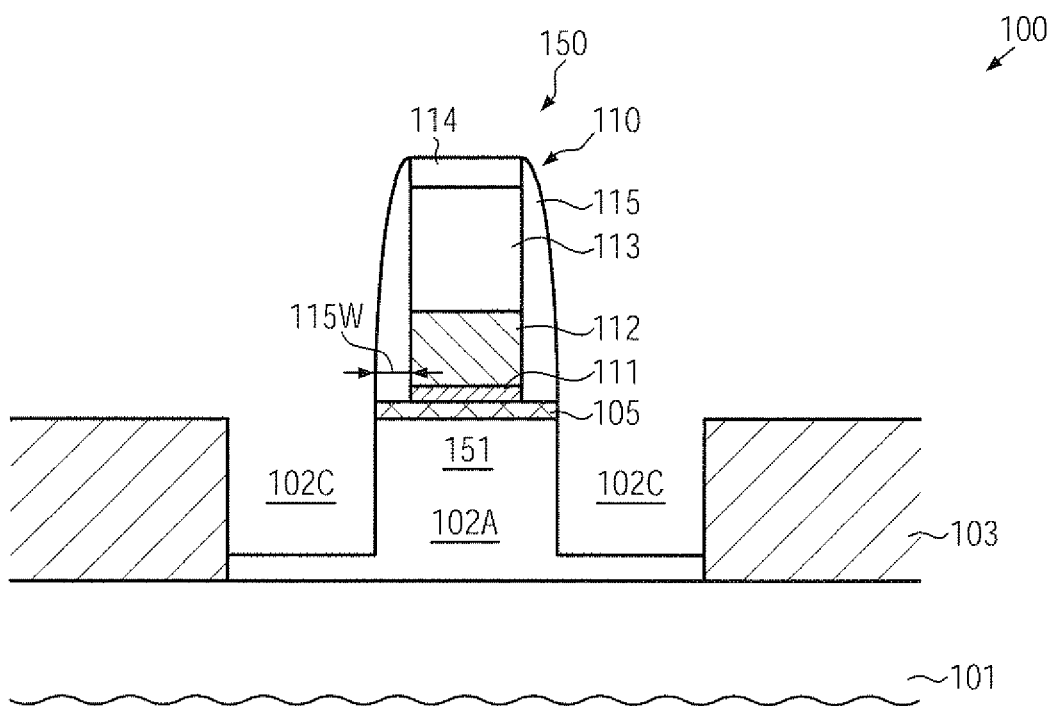

FIG. 1d schematically illustrates the device 100 in a further advanced manufacturing stage in which cavities 102C are formed in the active region 102A adjacent to the gate electrode structure 110. The cavities 102C may be formed on the basis of well-established anisotropic etch techniques, wherein the spacer element 115 may define lateral offset of the cavities 102C with respect to a channel region 151, i.e., an area within the semiconductor region 102A and the layer 105 that substantially corresponds to an area covered by the gate insulation layer 111. For example, for a highly anisotropic nature of the corresponding etch process, a width 115W of the spacers 115 may substantially define the corresponding offset of the cavities 102C. Thereafter, the device 100 may be prepared for a further selective epitaxial growth process which may include corresponding cleaning processes, for instance, on the basis of diluted hydrofluoric acid.

Figure 1E:
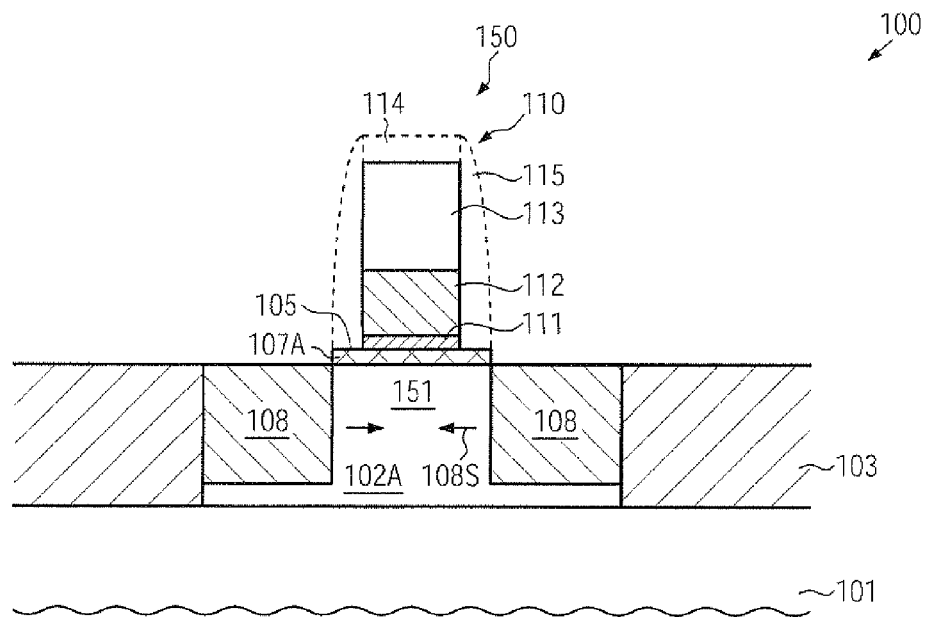

FIG. 1e schematically illustrates the semiconductor device 100 in a further advanced manufacturing stage, in which a strain-inducing semiconductor alloy 108 may be formed in the cavities 102C wherein, in the embodiment illustrated, the semiconductor alloy 108 may induce a compressive strain component 108S within the active region 102A and thus also in the channel region 151. For instance, the semiconductor alloy 108 may comprise germanium, tin and the like, so as to form a semiconductor material having a greater natural lattice constant compared to the silicon material of the region 102A. As previously explained, the tensile strain component, which may initially be created by the layer 105 when comprised of a silicon/germanium alloy, may be reduced or compensated for or overcompensated for by the species 107A so that the strain component 108S within the channel region 151 may represent combined strain effect of these mechanisms. Consequently, due to the incorporation of the species 107A, at least a pronounced reduction of the resulting channel strain may be avoided, while, in other cases, an increase of the overall strain-inducing effect may be accomplished on the basis of the species 107A.

Furthermore, in subsequent material removal processes, the spacer 115 and the cap layer 114 may be removed and the further processing may be continued on the basis of well-established process techniques.

Figure 1F:
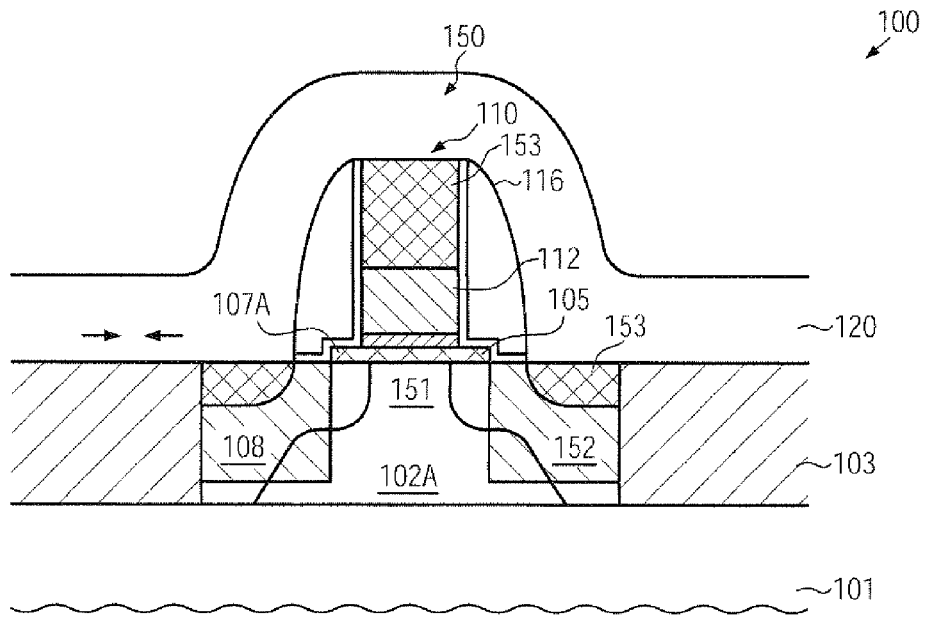

FIG. 1f schematically illustrates the semiconductor device 100 in a further advanced manufacturing stage, i.e., in a stage in which the basic configuration of the transistor 150 is completed. As illustrated, drain and source regions 152 may be formed in the active region 102A and at least partially in the strain-inducing semiconductor alloy 108. Furthermore, if required, a metal silicide material 153 may be formed in a portion of the drain and source regions 152. Additionally, the gate electrode structure 110 may comprise a spacer structure 116 which may have any appropriate configuration in accordance with process and device requirements. Additionally, the metal silicide material 153 may also be formed above the metal-containing gate electrode material 112 if required. In other cases, a significant portion of the material 113 (FIG. 1e) may have been removed after forming the drain and source regions 152 in order to reduce the resulting surface topography prior to the deposition of an interlayer dielectric material 120, a portion of which may, in some illustrative embodiments, be provided in the form of a highly-stressed dielectric material.

The transistor 150 may be formed on the basis of well-established process techniques including the formation of at least a portion of the drain and source regions 152 on the basis of ion implantation, possibly in combination with a dopant species incorporated in the material 108, followed by one or more anneal processes for activating dopants and for inducing a certain degree of dopant diffusion, if desired, and for re-crystallizing implantation-induced damage. Thereafter, the metal silicide material 153 may be formed on the basis of well-established techniques followed by the deposition of the material 120, which may be accomplished by using well-established deposition techniques in which, if desired, a high internal stress level may be accomplished in order to further enhance performance of the transistor 150. Thus, the transistor 150 may have incorporated therein to the gate electrode structure 110 based on the sophisticated gate insulation layer 111 and the highly conductive electrode material 112, wherein the layer 105 provides, in combination with an appropriate dopant profile of the drain and source regions 152 which may also include appropriately designed counter-doped regions as previously discussed, the threshold voltage, while at the same time the species 107A may reduce any negative impact on the efficiency of the strain-inducing mechanisms, such as the embedded semiconductor alloy 108 and/or the stressed dielectric material 120, for improving the overall strain in the channel region 151, while, in other cases, even an enhancement of the strain-inducing mechanism may be accomplished.

Figure 1G:
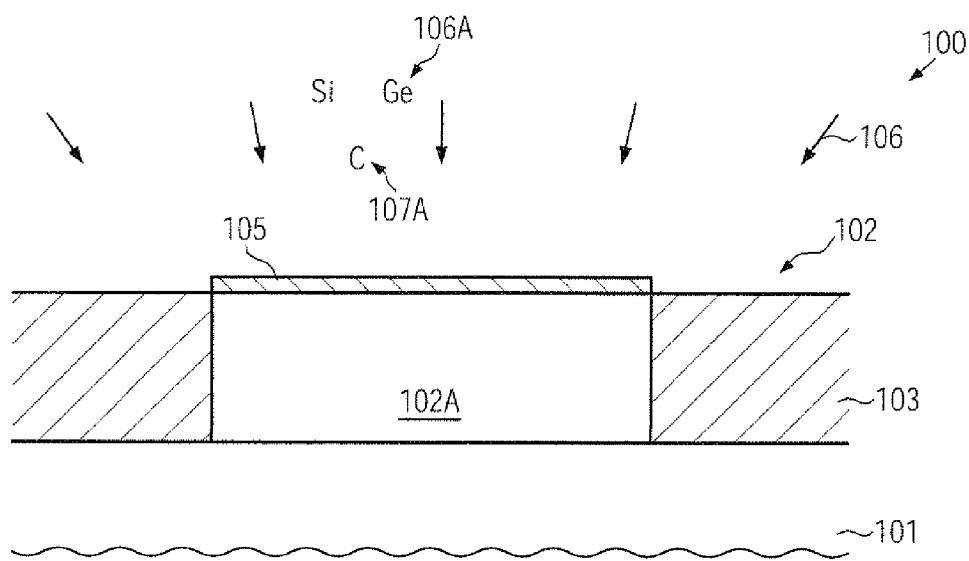
FIG. 1g schematically illustrates the semiconductor device in an early manufacturing stage for forming a threshold-adjusting semiconductor alloy in combination with the incorporation of a species for reducing negative strain effects, according to illustrative embodiments.

FIG. 1g schematically illustrates the semiconductor device 100 in an early manufacturing stage in which the device 100 is exposed to the selective epitaxial growth ambient 106 in order to form the layer 105, wherein, in addition to a non-silicon species 106A, such as germanium, that may be used for adjusting the threshold of the transistor still to be formed, concurrently the species 107A may be incorporated. For this purpose, the supply of precursor gases to the ambient of the process 106 may be appropriately controlled in order to obtain a desired concentration of the species 106A, 107A. In one illustrative embodiment, both species 106A, 107A may be incorporated with a substantially constant concentration during the entire deposition process, thereby also obtaining a substantially constant concentration across the entire thickness of the layer 105. In other cases, a variation of the concentration of at least one species may be accomplished by a corresponding control of supply of precursor gases. For instance, if desired, at an initial phase of the process 106, a desired concentration of the species 107A, for instance in the form of carbon, may be incorporated into the layer 105, thereby providing a compressive strain component as previously discussed. Thereafter, the species 106A may be added to the ambient 106 so as to obtain desired concentration at least at an upper portion of the layer 105 that may be in direct contact with the gate insulating material still to be formed. In other cases, a substantially pure silicon layer may be formed, for instance, as a final layer, when a silicon dioxide material is to be formed on the layer 105 on the basis of a controlled oxidation process prior to depositing the high-k dielectric material.

After incorporating the species 107A into the layer 105, the further processing may be continued as previously described with reference to FIGS. 1c-1f.

With reference to FIGS. 1h-1n, further illustrative embodiments will now be described in which a threshold-adjusting semiconductor alloy and a corresponding strain-adjusting species may be formed selectively in one type of active region while another type may be appropriately masked.

Figure 1H:
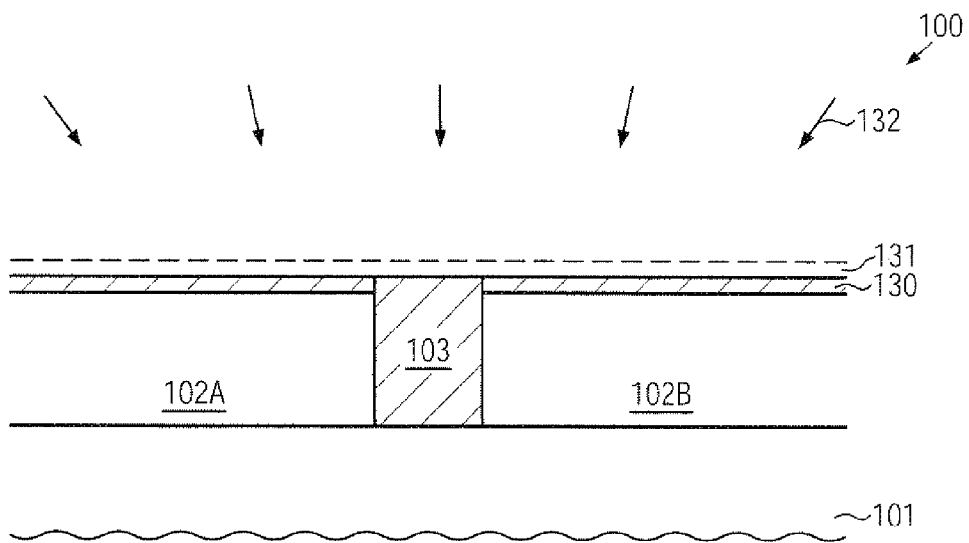
FIGS. 1h-1l schematically illustrate cross-sectional views of the semiconductor device during various manufacturing stages in forming sophisticated gate electrode structures for different types of transistors, while incorporating a threshold-adjusting species into one type and providing a strain adjustment species, according to still further illustrative embodiments.

FIG. 1h schematically illustrates the semiconductor device 100 in an early manufacturing stage wherein the isolation structure 103 separates the active region 102A from an active region 102B, which may be used for forming therein and thereabove a transistor which may not require a corresponding threshold-adjusting material layer. For example, the active region 102B may represent a transistor in which the metal-containing gate electrode material may result in an appropriate threshold voltage. For instance, an N-channel transistor may be formed in and above the active region 102B. Moreover, the device 100 is subjected to a process 132 for forming a mask layer above the active regions 102A, 102B. For example, in one illustrative embodiment, the process 132 may be performed as an oxidation process, thereby forming an oxide layer 130 in or on the active regions 102A, 102B. In other cases, the process 132 may comprise a deposition process, for instance for depositing an appropriate dielectric material, such as silicon dioxide, silicon nitride and the like, thereby forming a mask layer 131, as indicated by the dashed lines.

Figure 1I:
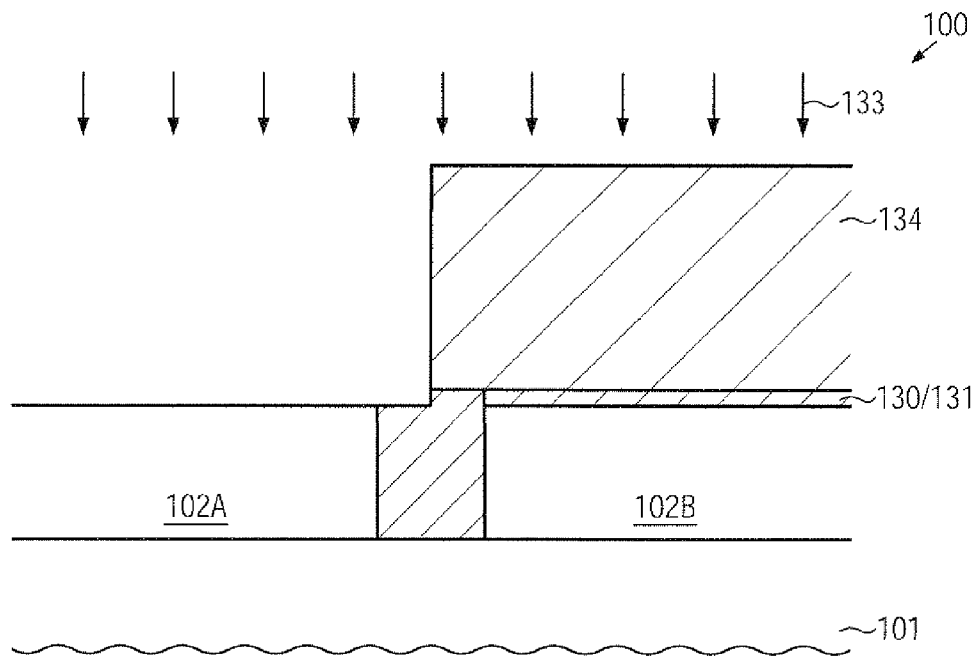

FIG. 1i schematically illustrates the semiconductor device 100 during an etch process 133 that may be performed on the basis of an etch mask 134, such as a resist mask. The process 133 may be designed to remove the exposed portion of the mask layer 130 or 131 and to expose the active region 102A. For instance, a plurality of efficient etch recipes are available for a plurality of materials, such as silicon dioxide, silicon nitride and the like. Thereafter, the mask 134 may be removed by wet chemical removal techniques and the like while maintaining the mask layer 130 or 131 above the active region 102B, thereby providing a hard mask for the further processing of the device 100. Thereafter, the device 100 may be exposed to cleaning recipes, as previously discussed, in order to prepare the exposed active region 102A for the deposition of a threshold-adjusting semiconductor alloy, as previously explained.

Figure 1J:
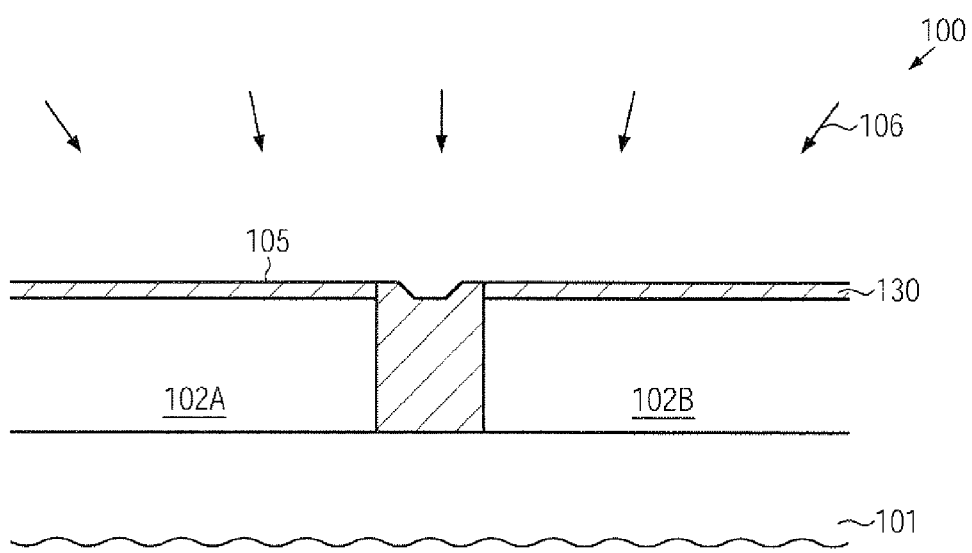

FIG. 1j schematically illustrates the device 100 during the selective epitaxial growth process 106, thereby forming the layer 105 above the region 102A while significant material deposition may be avoided due to the presence of the hard mask 130 above the active region 102B.

Figure 1K:
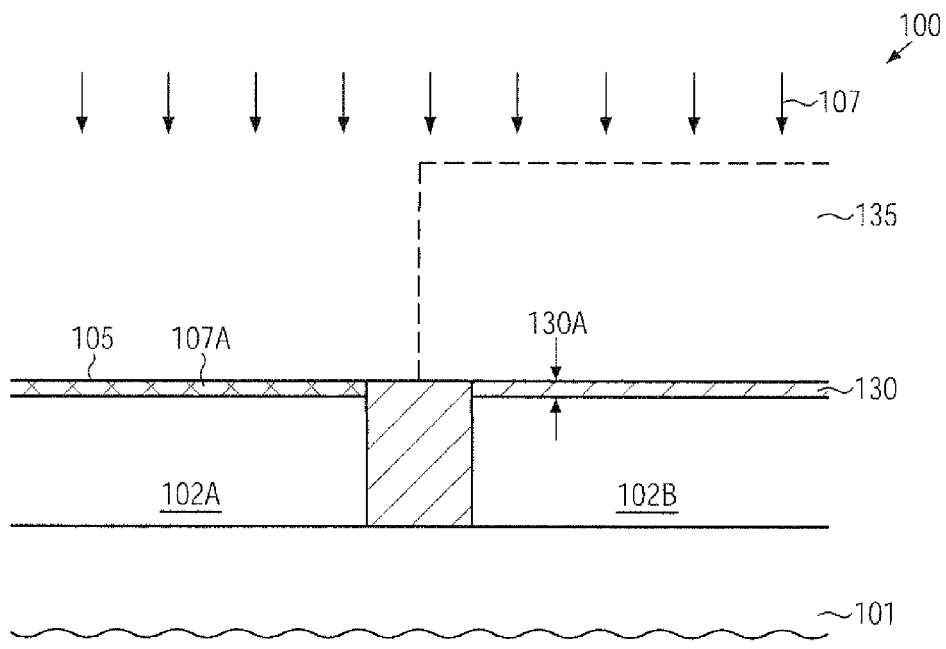

FIG. 1k schematically illustrates the device 100 when exposed to the ion bombardment 107 for incorporating the species 107A at least into the layer 105. It should be appreciated that, if desired, the maximum concentration of the species 107A may be positioned within the layer 105, while, in other cases, the maximum concentration may be positioned below the layer 105, depending on the desired strain-adjusting effect and influence on the overall electronic characteristics of the material 105. In one illustrative embodiment, as indicated by the dashed lines, the implantation process 107 may be performed on the basis of a further implantation mask 135, for instance provided in the form of a resist mask, so as to avoid incorporation of the species 107A in the active region 102B. For this purpose, an additional lithography step may be performed on the basis of well-established process strategies. In other illustrative embodiments, a thickness 130A of the hard mask 130 may be appropriately selected so as to provide the ion blocking capability during the process 107, thereby avoiding or at least significantly reducing penetration of the species 107A in the active region 102B. For example, as previously discussed, representing an N-channel transistor 102B, the incorporation of a compressive strain-inducing species may be considered inappropriate. After the implantation process 107, the further processing may be continued by removing the mask 135 and/or the hard mask 130 wherein, if the hard mask 130 is also used as an implantation mask, the corresponding species 107A contained therein may also be removed. Thereafter, the further processing my be continued by forming appropriate gate electrode structures.

Figure 1L:
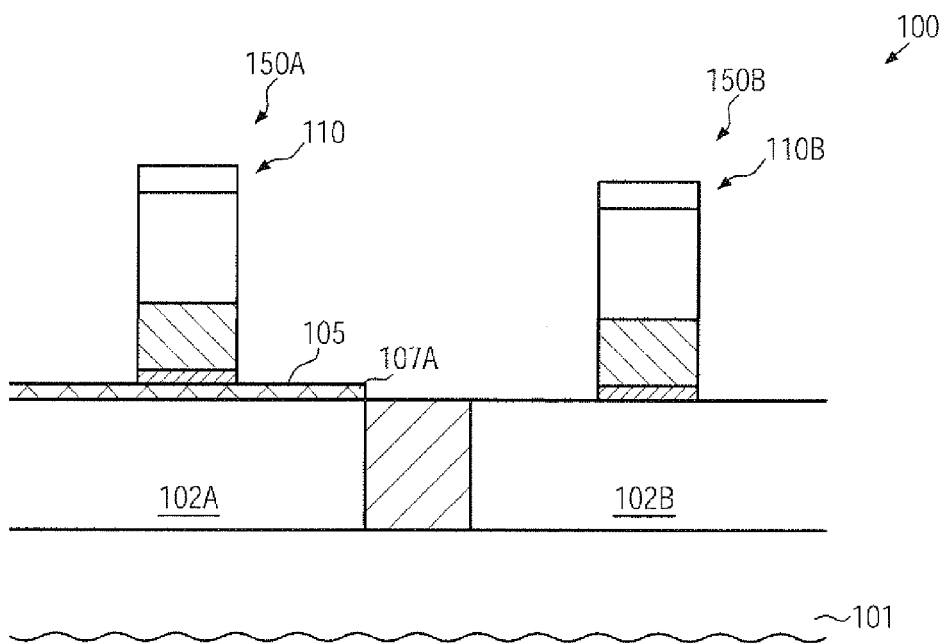

FIG. 1l schematically illustrates the semiconductor device 100 in an advanced manufacturing stage. As illustrated, a gate electrode structure 110 of a transistor 150A is formed above the active region 102A and a gate electrode structure 110B of a transistor 150B is formed above the active region 102B, where the gate electrode structures 110, 110B may have the same configuration, while nevertheless providing appropriate threshold voltages due to the presence of the layer 105 on the active region 102A as previously explained. Consequently, the gate electrode structures 110, 110B may be formed on the basis of process techniques as previously described. Thereafter, the further processing may be continued, for instance as previously described, wherein transistor 150B may be masked when a corresponding strain-inducing semiconductor alloy is to be selectively formed in the transistor 150A.

Figure 1M:
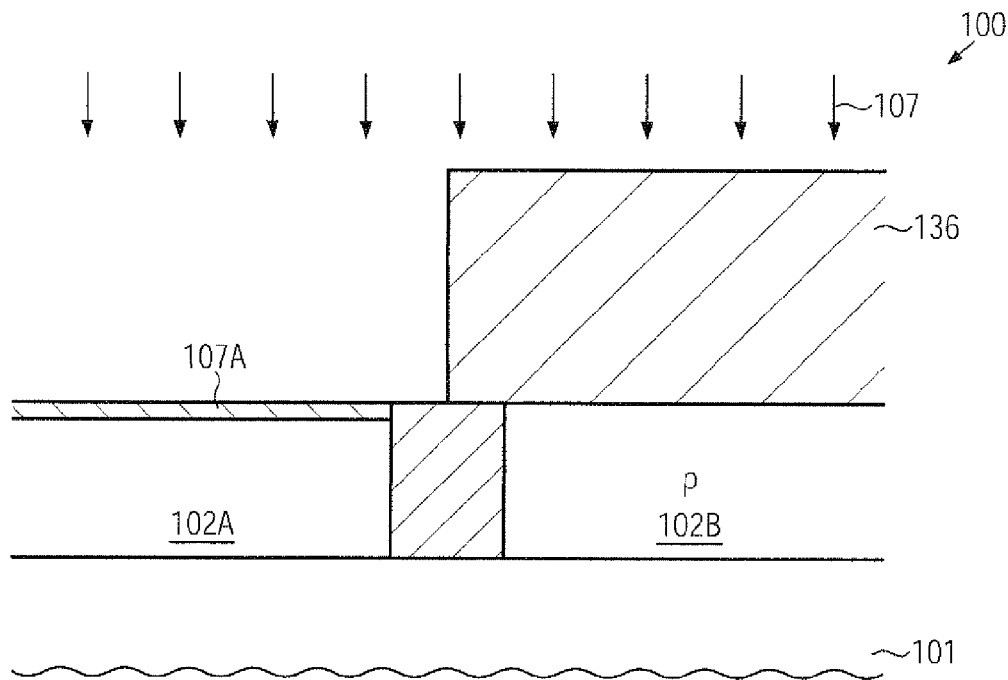
FIGS. 1m-1n schematically illustrate cross-sectional views of the semiconductor device including the different transistor types, wherein a strain adjustment species may be incorporated by ion implantation on the basis of an implantation mask without requiring additional photolithography, according to yet other illustrative embodiments.

FIG. 1m schematically illustrates the semiconductor device 100 according to further illustrative embodiments in which a basic dopant concentration may have been established in the active region 102B or may have still to be generated while a mask 136 may expose the active region 102A to an implantation sequence including the implantation process 107 for incorporating the species 107A and an implantation process for defining the basic dopant concentration in the active region 102A.

Figure 1N:
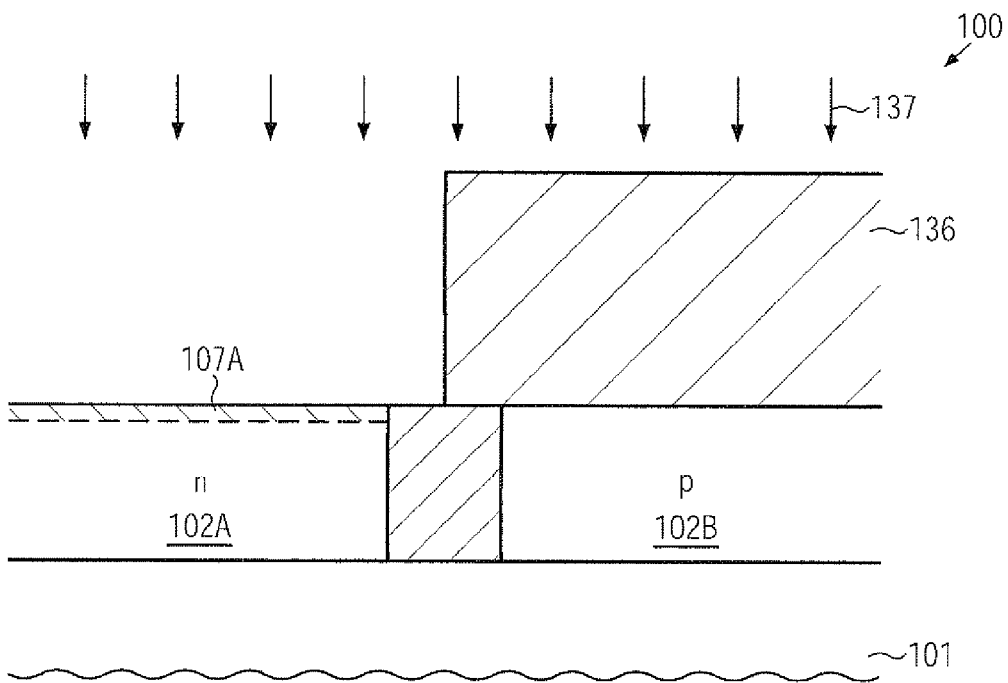

FIG. 1n schematically illustrates the device 100 exposed to a corresponding implantation process 137 in order to provide the basic dopant concentration in the active region 102A. It should be appreciated that the order of the implantation processes 107 and 137 illustrated in FIGS. 1n and 1m may be reversed, if desired, wherein both processes may still be performed on the basis of the same implantation mask 136. Consequently, an additional lithography step for providing an implantation mask may be avoided by introducing the species 107A in an early manufacturing stage. It should be appreciated that the entire sequence of introducing the corresponding dopant species into the active regions 102A, 102B may also be reversed. That is, the sequence of the processes 107, 137 in FIGS. 1m and 1n may be performed prior to doping the active region 102B, which may then be accomplished by removing the mask 136 and forming a corresponding mask covering the active region 102A. Thereafter, the further processing may be continued by selectively forming the threshold-adjusting semiconductor alloy in or on the active region 102A wherein the species 107A may provide the desired strain-adjusting effect as previously discussed.

As a result, the present disclosure provides semiconductor devices and techniques in which a sophisticated gate electrode structure may be formed in an early manufacturing stage on the basis of a high-k dielectric material and a metal-containing electrode material, wherein an adaptation of the threshold voltage may be accomplished by selectively providing a semiconductor alloy, such as a silicon/germanium alloy. The negative influence on the lattice structure in the channel region of the transistor may be reduced or may even be overcompensated for by additionally incorporating a tetravalent species, such as carbon, thereby providing an additional degree of freedom in adjusting the overall transistor characteristics, for instance by adjusting the magnitude and type of strain caused by the additionally incorporated species. Thus, in combination with one or more additional strain-inducing mechanisms, overall transistor performance may not be substantially negatively affected by the presence of the threshold-adjusting semiconductor material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of a silicon-containing semiconductor alloy on a silicon-containing crystalline semiconductor region, said semiconductor alloy comprising a first non-silicon species;
   introducing a second non-silicon species into said layer of silicon-containing semiconductor alloy, said second non-silicon species having the same valence as silicon and being different from said first non-silicon species; and
   forming a gate electrode structure of a transistor above said layer of a silicon-containing semiconductor alloy, said gate electrode structure comprising a high-k dielectric gate insulation layer and a metal-containing gate electrode material formed on said high-k dielectric gate insulation layer;
   forming a source region and a drain region in said silicon-containing crystalline semiconductor region; and
   adjusting a strain level of said silicon-containing semiconductor alloy by performing an annealing process subsequent to forming said source and drain regions.

2. The method of claim 1, wherein said first non-silicon species comprises germanium and said second non-silicon species comprises carbon.

3. The method of claim 1, wherein introducing said second non-silicon species comprises performing an ion implantation process.

4. The method of claim 3, wherein a maximum concentration of said second non-silicon species is positioned within said layer of a semiconductor alloy.

5. The method of claim 3, wherein a maximum concentration of said second non-silicon species is positioned below said layer of a semiconductor alloy.

6. The method of claim 1, wherein introducing said second non-silicon species comprises performing an epitaxial growth process.

7. The method of claim 6, wherein said layer of a semiconductor alloy is formed during at least a portion of said epitaxial growth process.

8. The method of claim 1, further comprising forming cavities in said silicon-containing semiconductor region offset from said gate electrode structure and filling said cavities with a second semiconductor alloy that induces strain in a channel region positioned below said gate electrode structure.

9. The method of claim 8, wherein said second semiconductor alloy comprises said first non-silicon species.

10. The method of claim 1, further comprising masking a second silicon-containing semiconductor region when forming said layer of semiconductor alloy and introducing said second non-silicon species into at least one of said layer of semiconductor alloy and said silicon-containing semiconductor region.

11. The method of claim 10, wherein masking said second silicon-containing semiconductor region comprises forming a hard mask above said second silicon-containing semiconductor region prior to forming said layer of semiconductor alloy.

12. The method of claim 11, further comprising forming a resist mask above said second silicon-containing semiconductor region prior to introducing said second non-silicon species.

13. The method of claim 11, wherein said hard mask is used as a mask when introducing said second non-silicon species.

14. The method of claim 13, wherein said second non-silicon species is introduced by performing an implantation process.

15. A method, comprising:
   forming a threshold-adjusting semiconductor alloy on a silicon-containing semiconductor region;
   providing a strain-adjusting species at least in said threshold-adjusting semiconductor alloy; and
   forming a gate electrode structure of a transistor above said threshold-adjusting semiconductor alloy, said gate electrode structure comprising a high-k dielectric material formed at least above said threshold-adjusting semiconductor alloy, said gate electrode structure further comprising a metal-containing electrode material formed above said high-k dielectric material;
   forming a source region and a drain region in said silicon-containing semiconductor region; and
   adjusting a strain level of said threshold-adjusting semiconductor alloy by performing an annealing process subsequent to forming said source and drain regions.

16. The method of claim 15, wherein providing said strain-adjusting species comprises performing an implantation process to introduce a non-silicon species having the same valence as silicon.

17. The method of claim 16, wherein said implantation process is performed on the basis of a resist mask used for introducing a dopant species into said silicon-containing semiconductor region.

18. The method of claim 16, further comprising forming an implantation mask after forming said threshold-adjusting semiconductor alloy and performing said implantation process on the basis of said implantation mask.

19. The method of claim 15, wherein providing said strain-adjusting species comprises incorporating a non-silicon species during an epitaxial growth process that is performed to form said threshold-adjusting semiconductor material.

20. The method of claim 15, wherein said threshold-adjusting semiconductor alloy comprises a silicon/germanium alloy.

* * * * *